United States Patent [19]

Chung et al.

[11] Patent Number: 5,336,371

[45] Date of Patent: Aug. 9, 1994

[54] SEMICONDUCTOR WAFER CLEANING AND RINSING TECHNIQUES USING RE-IONIZED WATER AND TANK OVERFLOW

[75] Inventors: Bryan C. Chung, Hampton, N.J.; Gerald N. DiBello, Boyertown, Pa.; Charles W. Pearce, Emmaus, Pa.; Kevin P. Yanders, Allentown, Pa.

[73] Assignee: AT&T Bell Laboratories, Murray Hill, N.J.

[21] Appl. No.: 34,938

[22] Filed: Mar. 18, 1993

[51] Int. Cl.$^5$ .................. H01L 21/00; H01L 21/02; B44C 1/22; C03C 15/00
[52] U.S. Cl. .................. 156/659.1; 437/229
[58] Field of Search .................. 156/659.1; 437/229

[56] References Cited

U.S. PATENT DOCUMENTS 5,175,124 12/1992 Winebarger .................. 156/659.1

Primary Examiner—R. Bruce Breneman
Assistant Examiner—B. Everhart
Attorney, Agent, or Firm—Roderick B. Anderson

[57] ABSTRACT

In a wafer fabrication process in which a photoresist stripper must be removed from the surface of a semiconductor wafer, the photoresist stripper is rinsed by inserting the wafer in a vessel (23, FIG. 3) filled with water and simultaneously pumping carbon dioxide and water into the vessel to cause the water to overflow the vessel. Preferably, the wafer is contained within the vessel for at least five minutes, and, during the rinsing step, the water completely fills the vessel and overflows at a rate of at least fifty percent of the volume of the vessel each minute. We have found that this method of rinsing photoresist stripper from semiconductor wafers significantly reduces or eliminates the incidence of corrosion pitting on aluminum conductors (12, FIG. 1) of the wafer (11).

12 Claims, 1 Drawing Sheet

SEMICONDUCTOR WAFER CLEANING AND RINSING TECHNIQUES USING RE-IONIZED WATER AND TANK OVERFLOW

TECHNICAL FIELD

This invention relates to semiconductor wafer fabrication and, more particularly, to methods for rinsing photoresist stripper materials from wafer surfaces.

BACKGROUND OF THE INVENTION

Microelectronics chips such as integrated circuits are made from comparatively large wafers of semiconductor material by processes known as wafer fabrication. A fundamental step in wafer fabrication is photolithographic masking and etching which is used to define selected regions of the wafer for such processing as etching or impurity diffusion. The photolithography process requires a photoresist coating which is first selectively developed to permit selective processing, and which is thereafter removed by a chemical known as a photoresist stripper. After photoresist stripping, the photoresist stripper must in turn be removed from the wafer by a process known as rinsing.

As described, for example, in the paper, "A Simple Model for Rinsing," A. Tonti, Electrochemical Society Meeting, October 1991, one method of rinsing is to immerse the wafers in a tank into which water and nitrogen are pumped so that the water overflows the tank. Another method, known as the quick dump rinse (QDR) method, requires water in which wafers are contained to be quickly emptied or dumped.

A problem with the various rinsing methods using water is the tendency of aluminum layers on the surface of the wafer, such as are used as conductors and bonding pads, to corrode during the rinse cycle. Such corrosion is typically characterized by pits in the surface of the aluminum conductors which, with the progressive reduction in the size of conductors on the surface of microchips, become a progressively more serious problem. Our experiments show that rinsing in isopropyl alcohol can reduce pitting, but such use is undesirable because isopropyl alcohol is more expensive than water, and it constitutes a waste that may be harmful to the environment. Thus, there is a continued long-felt need in the industry for a method for rinsing photoresist stripper from wafer surfaces which does not corrode aluminum conductors on the wafers and which is not unduly expensive or harmful to the environment.

SUMMARY OF THE INVENTION

In a wafer fabrication process in which a photoresist stripper must be removed from the surface of a semiconductor wafer, the photoresist stripper is rinsed by inserting the wafer in a vessel filled with water and simultaneously pumping carbon dioxide and water into the vessel to cause the water to overflow the vessel. Preferably, the wafer is contained within the vessel for at least five minutes, and, during the rinsing step, the water completely fills the vessel and overflows at a rate of at least fifty percent of the volume of the vessel each minute. We have found that this method of rinsing photoresist stripper from semiconductor wafers significantly reduces or eliminates the incidence of corrosion pitting on aluminum conductors of the wafer. These and other objects, features and benefits of the invention will be better understood from a consideration of the following detailed description taken in conjunction with the accompany drawing.

DETAILED DESCRIPTION

Figure 1:
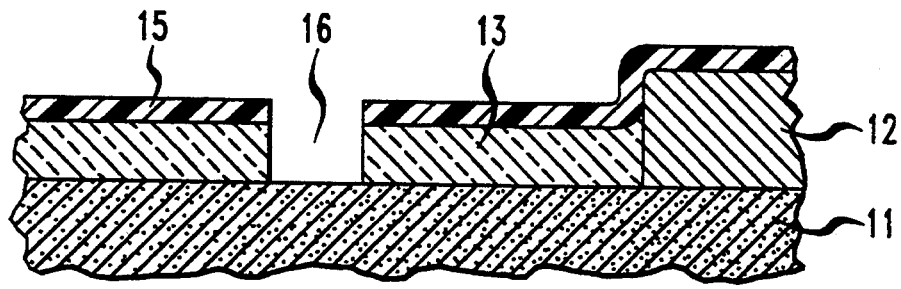
FIG. 1 is a schematic view of part of a semiconductor wafer illustrating the photolithographic masking and etching process.

Referring now to FIG. 1, there is shown a semiconductor wafer 11, which may be of silicon, including on an upper surface thereof an aluminum contact 12 and an insulative layer 13 of a material such as silicon dioxide. The aluminum contact may be an aluminum alloy containing, e.g., copper, as is known in the art. For the purpose of selectively etching, for example, the dielectric layer 13, the upper surface of the wafer is coated with photoresist 15 which is selectively exposed to actinic light and developed to remove a portion thereof for permitting etching of part of the underlying dielectric layer 13. The wafer is then exposed to an etchant of silicon dioxide, which preferentially etches an opening 16 in the exposed silicon dioxide, with the photoresist mask 15 preventing the unwanted etching of other areas of the silicon dioxide.

Figure 2:
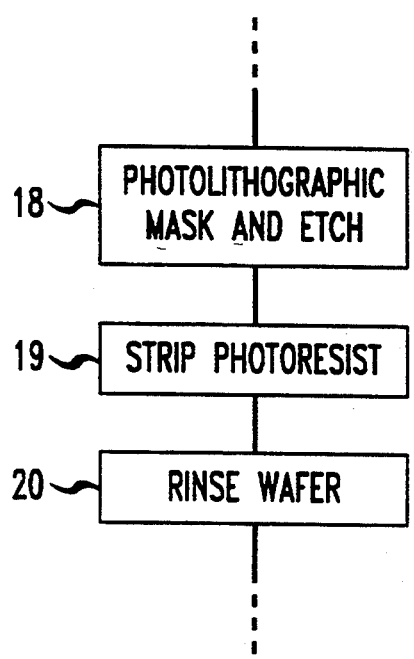
FIG. 2 is a flow diagram showing part of the wafer fabrication process, including the step of rinsing the wafers.

The FIG. 1 method is just one example of many photolithographic mask and etch steps that are typically performed during the course of a typical wafer fabrication. As such, it constitutes one step 18 of FIG. 2 in the wafer fabrication process. Following this step, the next step in the wafer fabrication is that shown by step 19, stripping the photoresist layer 15 from the surface of the wafer. This is typically done by exposing the wafer to a chemical etchant which selectively dissolves and removes the photoresist layer 15 while leaving the remainder of the wafer intact. Examples of photoresist strippers include PRS-1000, commercially available from the Baker Chemical Company of Phillipsburg, N.J. and ACT-CMI and ACT-150, available from ACT, Inc. of Allentown, Pa. As shown by step 20, after the photoresist strip, residual photoresist stripper must be normally removed from the wafer by rinsing. Deionized (DI) water has been used as a medium for rinsing but, as mentioned above, such conventional rinsing with water or DI water typically results in corrosion of the upper surfaces of aluminum conductors such as contact 12 of FIG. 1.

Figure 3:
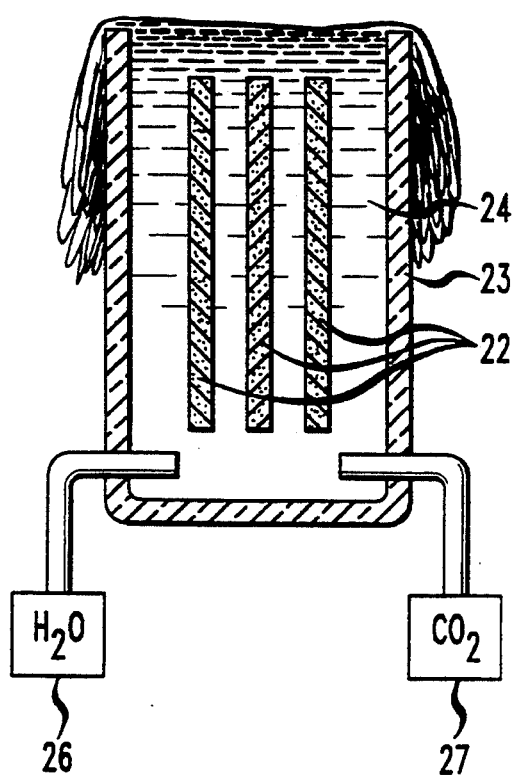
FIG. 3 is a schematic view illustrating a method for rinsing wafers in accordance with an illustrative embodiment of the invention.

In accordance with the invention, this problem is overcome by rinsing semiconductor wafers 22 in the apparatus shown in FIG. 3. The wafers containing a film of residual photoresist stripper are inserted in a vessel 23 filled with DI water 24. DI water from source 26 and carbon dioxide from source 27 is then pumped into the vessel as shown. This causes the water to overflow the vessel, and during the entire rinsing operation water overflows as shown in the Figure.

The volume of vessel 23 that was used was four gallons, and the rate of carbon dioxide flow was approximately three liters per minute. We found that the water flow rate should be at least two gallons per minute (fifty percent of vessel volume per minute), and the rinse time should be at least five minutes and preferably ten minutes. We found that if the rinse lasted as long as twenty minutes, pits did form and that it is therefore advisable, with the above parameters, to have a rinse time of less than twenty minutes.

To define the invention more clearly, we compared the process of FIG. 3 with one in which nitrogen, rather than carbon dioxide, was used as the gas source. We also compared it with rinsing using the quick dump rinse (QDR) method, both with nitrogen and carbon dioxide gas bubbling. The results of these tests are shown on Table I. The numbers in parentheses in the first column represent the number of minutes of overflow rinse that was used. The designation of certain "pits" in parentheses indicates that an experiment showing pits was not actually done, but that from the other experiments, it is certain that pits would occur. The water flow rate for the overflow (OF) method was 2.5 gallons per minute (62.5% of vessel volume per minute). The aluminum conductors on one surface were deposited using standard deposition parameters and had a composition of 95.54 weight percent Al, 0.45 weight percent Cu, and 0.1 weight percent Si.

TABLE I

| Rinse Mode (min.) | Gas Bubbling | | |
| --- | --- | --- | --- |
|  | $N_2$ | $CO_2$ | None |
| 1QDR | — | No Pits | — |
| 5 QDR | Pits | Pits | (Pits) |
| OF Rinse (5) | Pits | No pits | Pits |
| OF Rinse (10) | Pits | No Pits | (Pits) |
| OF Rinse (20) | (Pits) | Pits | (Pits) |

One can see from Table I that with a single quick dump rinse using carbon dioxide bubbling, one desirably got no corrosion and therefore no pits. Unfortunately, one quick dump rinse was not satisfactory for removing the photoresist stripper. Five quick dump rinses (5QDR) were sufficient for this purpose, but they caused pits, whether there was nitrogen or carbon dioxide bubbling. A five minute overflow rinse using nitrogen bubbling resulted in pits, but with carbon dioxide bubbling, no pits. It appeared that about five minutes was required for dependable removal of the photoresist stripper and so rinsing for time periods less than that is not recommended, at least with the strippers mentioned above. Overflow rinse for ten minutes worked well in preventing pits, but, as mentioned before, the twenty minute rinse did result in pits, undoubtedly because of the increased time during which galvanic reactions resulting in pits could occur.

In summary, an effective method has been described for rinsing photoresist stripper in a way that prevents aluminum corrosion responsible for pitting. Several examples of ranges of parameters have been given. Various other embodiments and modifications may be made by those skilled in the art without departing from the spirit and scope of the invention.

The following is a theoretical discussion of why the invention is superior to competing methods, but it is to be understood that applicant's invention is based on experimental observation, rather than any particular theory of operation:

The amine components contained in photoresist strippers turn very caustic when they come into contact with water, as happens during the DI water rinse cycle, and etch the aluminum alloy, if not rinsed off rapidly. When DI water is bubbled with $CO_2$ gas, as is done currently, some of it dissolves and dissociates into protons and bicarbonate ions under equilibrium. The water becomes acidic, attaining a pH value of 4–6 depending on the dissolved amount of $CO_2$. This acidic water will then rapidly neutralize the caustic photoresist stripper/water mixture.

1QDR did not cause pitting corrosion, whereas 5QDR resulted in many, deep and large corrosion pits, in spite of $CO_2$ bubbling. This fact suggests that one of the governing cathodic reactions might involve the reduction of the dissolved oxygen in the acidic DI water. The reversible potential for the reduction of oxygen is reported to be $E_{REV} = -0.82 \text{ V}_{SHE}$, and for the oxidation of Al to be $E_{REV} = -1.66 \text{ V}_{SHE}$, with a potential difference of 2.48 V. Thus, a galvanic couple between the aluminum and a more noble constituent, such as $Al_2Cu$, would provide a tendency to form a local corrosion cell.

During the 5QDR cycle, spraying water as well as the thin layers of water covering the wafers become amply exposed to the air. It is presumed that, due to a large surface area compared to a small volume of water, oxygen dissolves in the water rapidly to promote the cathodic reaction. Also, caused by the turbulence created during the dump cycle, some of the dissolved $CO_2$ might escape from the thin layers of water, becoming ineffective in inhibiting the corrosion. When wafers are immersed in overflowing water bubbled with $CO_2$, they are exposed to higher concentrations of $CO_2$. Also, in the overflow mode, the top surface of the water is small relative to the total amount of water, and therefore the wafers have a more limited access to air.

We claim:

1. A method for removing a photoresist layer from a semiconductor wafer having aluminum-containing structures thereon comprising the steps of:
   exposing the photoresist layer to a photoresist stripper to remove the photoresist layer;
   rinsing the photoresist stripper from the semiconductor wafer comprising the step of inserting the wafer in a vessel filled with water;
   pumping carbon dioxide into the vessel and simultaneously pumping water into the vessel to cause the water to overflow the vessel;
   during the rinsing step, the water completely filling the vessel and overflowing at a rate of at least fifty percent of the volume of the vessel each minute.

2. The method of claim 1 wherein:
   during the rinsing step, the wafer is contained within the vessel for at least five minutes.

3. The method of claim 1 wherein:
   the volume of the vessel is approximately four gallons, and the rate of flow of water into the vessel is approximately 2.5 gallons per minute.

4. The method of claim 1 wherein:
   during the rinsing step, the wafer is contained within the vessel for at least five minutes.

5. The method of claim 4 wherein:
   during the rinsing step, the wafer is contained within the vessel for less than twenty minutes.

6. The method of claim 5 wherein:
   the wafer is contained within the vessel for approximately ten minutes.

7. The method of claim 6 wherein:
   a plurality of wafers are contained within the vessel during the rinsing step.

8. A method for fabricating semiconductor devices from a semiconductor wafer containing aluminum conductors on one surface thereof comprising the steps of:

coating the wafer with a photoresist layer; selectively exposing the photoresist to actinic light; developing the photoresist; using the developed photoresist as a mask to permit selective processing of the wafer; removing the photoresist mask by exposing the wafer to a photoresist stripper; rinsing the photoresist stripper from the semiconductor wafer comprising the step of inserting the wafer in a vessel filled with water; wherein the improvement comprises:

simultaneously pumping carbon dioxide and water into the vessel to cause the water to overflow the vessel;

during the rinsing step, the water completely filling the vessel and overflowing at a rate of at least fifty percent of the volume of the vessel each minute.

9. The method of claim 8 wherein:

during the rinsing step, the wafer is contained within the vessel for between five and twenty minutes.

10. The method of claim 9 wherein:

the volume of the vessel is approximately four gallons, and the rate of flow of water into the vessel is approximately 2.5 gallons per minute;

and a plurality of wafers are contained within the vessel during the rinsing step.

11. The method of claim 9 wherein:

the aluminum conductors comprise an aluminum alloy comprising more than ninety percent aluminum.

12. The method of claim 11 wherein:

the aluminum conductors comprise about ninety-five percent aluminum, four to five percent copper, and a trace of silicon.

* * * * *

UNITED STATES PATENT AND TRADEMARK OFFICE
CERTIFICATE OF CORRECTION

PATENT NO. : 5,336,371
DATED : August 9, 1994
INVENTOR(S) : B.C. Chung, et. al.

It is certified that error appears in the above-indentified patent and that said Letters Patent is hereby corrected as shown below:

Title page, item ]54], and col. 1, line 2,

IN THE TITLE
"Semiconductor Wafer Cleaning and Rinsing Techniques Using Re-Ionized Water and Tank Overflow" should read --Semiconductor Wafer Cleaning and Rinsing Techniques Using Water and Tank Overflow--.

Signed and Sealed this

Twenty-fourth Day of January, 1995

Attest:

BRUCE LEHMAN

Attesting Officer

Commissioner of Patents and Trademarks